United States Patent [19]

McBride

[11] Patent Number: 5,689,634
[45] Date of Patent: Nov. 18, 1997

[54] THREE PURPOSE SHADOW REGISTER ATTACHED TO THE OUTPUT OF STORAGE DEVICES

[75] Inventor: John G. McBride, Fort Collins, Colo.

[73] Assignee: Hewlett-Packard Co., Palo Alto, Calif.

[21] Appl. No.: 717,646

[22] Filed: Sep. 23, 1996

[51] Int. Cl.[6] .................................................. H04B 17/00
[52] U.S. Cl. .............................. 395/183.15; 395/183.15; 371/21.1; 371/22.5; 371/49.1
[58] Field of Search ................... 364/265; 395/183.15, 395/474, 457; 371/21.1, 49.1, 37.7, 22.5, 22.4

[56] References Cited

U.S. PATENT DOCUMENTS

| | | | |
|---|---|---|---|
| 4,048,624 | 9/1977 | Cochran et al. | 364/200 |
| 4,342,079 | 7/1982 | Stewart et al. | 364/200 |
| 4,414,669 | 11/1983 | Heckelman et al. | 371/49.1 |
| 5,077,738 | 12/1991 | Larsen et al. | 371/21.1 |
| 5,091,851 | 2/1992 | Shelton et al. | 395/455 |
| 5,541,936 | 7/1996 | Tanaka | 371/25.1 |
| 5,581,564 | 12/1996 | Miller et al. | 371/22.1 |

*Primary Examiner*—Robert W. Beausoliel, Jr.
*Assistant Examiner*—Luan C. Do

[57] ABSTRACT

A multi-purpose shadow register apparatus in a computer system having a central processing unit, a memory, a memory output select circuit, and a memory output bus includes a shadow register in parallel with the memory output select circuit. The shadow register is connected to receive memory output data from the memory output bus and is responsive to an output enable signal to provide shadow register output data on a shadow register output bus. A shadow register functional logic block which provides a plurality of functional blocks utilize the shadow register in a mutually time-exclusive manner.

16 Claims, 8 Drawing Sheets

THREE PURPOSE SHADOW REGISTER ATTACHED TO THE OUTPUT OF STORAGE DEVICES

FIELD OF THE INVENTION

The present invention relates generally to a computer system memory device, and more particularly, to a three purpose shadow register attached to the output of such memory device for providing three mutually time-exclusive functions.

BACKGROUND OF THE INVENTION

Computer systems generally include a central processing unit (CPU) and a main memory from which the CPU fetches instructions and data. Modern computer systems also generally employ one or more cache memories to increase system performance. A cache memory is a small, high-speed buffer memory which is used to hold temporarily those portions of the contents of main memory which it is believed will be used in the near future by the CPU. The main purpose of a cache, which has typical access times on the order of 5 to 10 times faster than a system's main memory, is to shorten the time necessary to perform memory accesses, either for data or instruction fetch, and therefore to improve system performance.

Fetches from a main memory or from a cache memory share common procedural operations. Along with the basic write/read operations to and from the memory device during normal operation, several diagnostic and error checking functions are also often performed on the memory device to increase accuracy and detect errors.

As one example, a memory self-test is often performed as part of the system initialization when a computer system is first powered on or reset. The memory self-test typically includes several iterations of writing various values to each memory location and performing a read-back-check on each memory location. If the read-back-check detects an error, this could indicate a bad memory location due, for example, to a stuck bit. Another type of memory test performed is a cyclical redundancy test (CRC), which is known in the art. To perform a CRC test, the data from each memory location must be pre-processed by a checksum generator which generates a final checksum or "signature" by cumulatively processing each data item through a polynomial function. The checksum is written to a memory location, typically the last location in memory. This type of CRC test is also known as "signature analysis". A typical power-on or reset sequence will include a signature analysis in which each memory location is read and sent through a signature analyzer implementing the same cumulative polynomial function as the original checksum generator. The final signature generated by the signature analyzer is compared to the original signature. Mismatching signatures indicate corrupted data in memory or stuck bits.

Another type of error checking function typically performed on data to or from memory devices is parity checking. There are many standard parity checking methods ranging from a simple exclusive-or of all the bits in a data word to a complicated polynomial function. A parity error may result, for example, from a stuck bit in memory, system noise or alpha strikes. The parity error handler may also range from simple to complex, as for example, from a simple general detection and signaling of a parity error, which causes system operation to halt, to a complex error logging function whereby the data item and other information of a particular data item which generates a parity error are logged, and operation continues.

Other memory device operations often provided in computer systems are diagnostic functions which allow the CPU to write to and read from any memory location. Diagnostic functions assist system developers in detecting and debugging hardware and software design flaws.

In prior art systems, each of the above-described memory device functions, if they are performed at all, are generally performed separately using separate hardware registers. Separate hardware requires additional system expense, use of valuable integrated circuit space, and often slows down system speed. A need exists for a cost-effective, space and time efficient apparatus and method for allowing multiple memory functions to be performed using the same hardware register such as memory self-tests, parity checking, and system diagnostics.

SUMMARY OF THE PRESENT INVENTION

Therefore, in accordance with the present invention, a cost-effective, space and time efficient three purpose shadow register attached to the output of storage devices is presented. The multi-purpose shadow register apparatus of the present invention operates in a computer system. The computer system includes a central processing unit, a memory, a memory output select circuit, and a memory output bus which provides memory output data from the memory to the memory output select circuit.

The multi-purpose shadow register apparatus of the present invention includes a shadow register in parallel with the memory output select circuit. The shadow register is connected to receive memory output data from the memory output bus and functional logic block data from a functional logic block data bus. The shadow register includes bus selection means for selecting input from either the memory output bus or the functional logic block data bus. The shadow register is responsive to an output enable signal which signals the shadow register when to provide shadow register output data on a shadow register output bus.

The multi-purpose shadow register apparatus further includes a shadow register functional logic block. The shadow register functional logic block comprises a plurality of functional blocks, each of which utilize the shadow register in a mutually time-exclusive manner. The shadow register functional logic block outputs functional logic block data to the functional logic block data bus.

In the preferred embodiment, the shadow register functional logic block includes functional blocks comprising a signature analyzer, a parity checker, and a diagnostics read circuit. The signature analyzer is connected to receive the memory output data from the memory output bus. The signature analyzer performs a signature analysis function on the memory output data and produces signature data as the functional logic block data on the functional logic block data bus. The parity checker is connected to receive the memory output data from the memory output bus. The parity checker detects parity errors in the memory output data and provides a parity error indicator from which the memory output data is caused to be trapped in the shadow register and provided as shadow register output data on the shadow register output bus. The bus selection means of the shadow register is configured to select as input the functional logic block data from the functional logic block data bus when the signature analyzer is in operation and configured to select as input the memory output data from the memory output bus when the parity checker or the diagnostics read circuit is in operation.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE INVENTION

Figure 1:
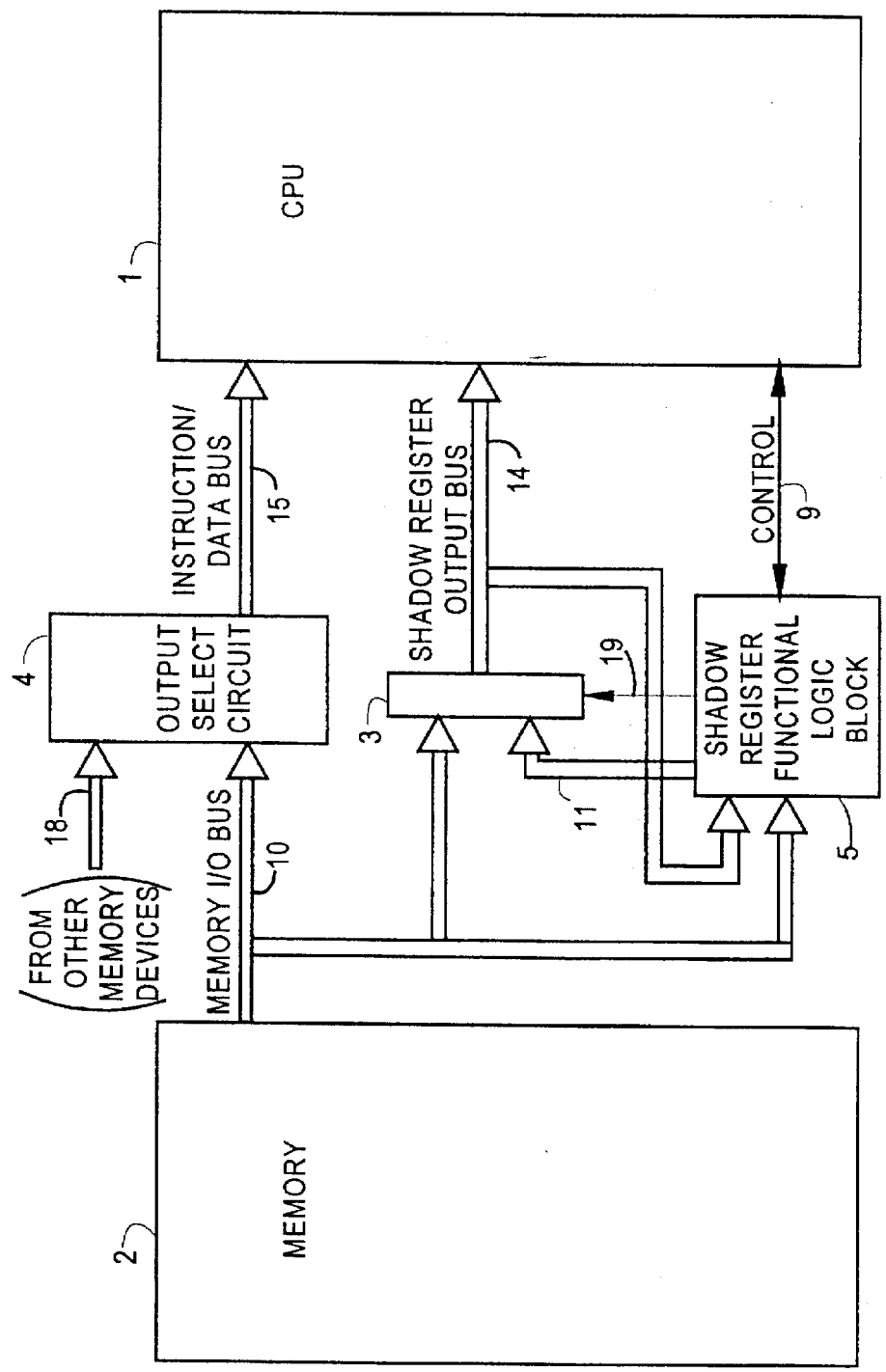
FIG. 1 is a block diagram of a computer system in which the present invention operates.

In FIG. 1, a central processing unit (CPU) 1 performs reads and writes of memory 2. Instructions and data passes between the memory 2 and CPU 1 via an output select circuit 4. The output select circuit 4 receives data from memory 2 via memory I/O bus 10. The output select circuit 4 may also receive data from other memory devices in a computer system having multiple memories or memory levels, or from internal or external memory-mapped locations in the system. Such devices are not shown in FIG. 1, but data from such devices are shown generally as feeding into the output select circuit 4 on one or more data buses 18. The output select circuit 4 is a controller circuit for selecting which input data is selected for output to the CPU 1 on an instruction/data bus 15.

In accordance with the present invention, instructions and data passing between the CPU 1 and memory 2 may also pass through a shadow register 3. Access to the shadow register 3 and operations performed on the contents of the shadow register 3 are controlled by a shadow register functional logic block 5, which may further be controlled by the CPU 1 via control lines 9. The shadow register 3 may receive data from the memory I/O bus 10 or processed data from the shadow register functional logic block 5 on a shadow register functional logic block output bus 11, referred to as the signature bus in the preferred embodiment. Shadow register output data is placed on a shadow register output bus 14, which is connected logically as an extension of an internal diagnose bus in the CPU 1. The shadow register functional logic block 5 produces control signals 19 which cause the shadow register 3 to select between the data received on the memory I/O bus 10 or the processed data received on signature bus 11 for output onto the shadow register output bus 14.

Figure 2:
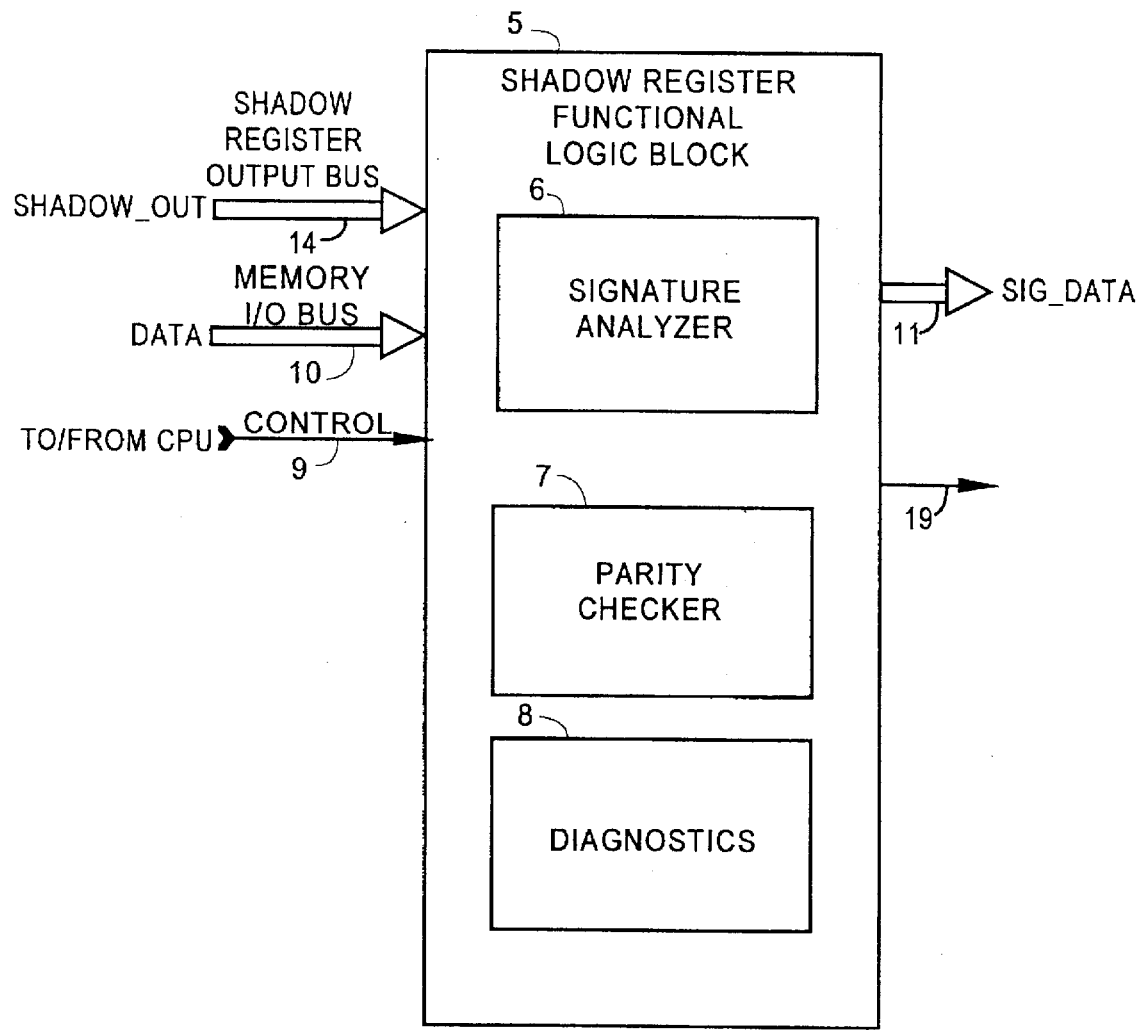
FIG. 2 is a block diagram of a shadow register controller in accordance with the present invention.

FIG. 2 is a more detailed block diagram of the shadow register functional logic block 5. The functions implemented by the shadow register functional logic block 5 may reside in close proximity on a separate integrated circuit, or may be implemented within the CPU 1 itself, or may be implemented in separate functional blocks throughout the system. FIG. 2 shows the various functions implemented in the preferred embodiment by the shadow register functional block 5 as grouped together for convenience of illustration. As shown in FIG. 2, the shadow register functional logic block 5 may include various functional blocks. Each functional block utilizes the shadow register 3 at mutually exclusive times for different uses. For example, as shown in FIG. 2, a signature analyzer 6 may use the shadow register 3 for performing a memory test at power-up time, while a parity checker 7 may use the shadow register for checking parity during normal system operation, and a diagnostics block 8 may utilize the shadow register 3 for reading any location in the memory 2 during system debugging. The shadow register functional logic block 5 may include other functional blocks for performing other functions as long as each functional block maintains mutual time exclusivity. As shown in FIG. 2, the shadow register functional logic block 5 in the preferred embodiment receives data from memory 2 on memory I/O bus 10 and data from the shadow register 3 on shadow register output bus 14. The shadow register functional logic block 5 produces processed data at its output on a signature bus 11. A plurality of control signals 9 pass between the CPU 1 and the shadow register functional logic block 5 to enable operation of one of the functional blocks, to select as data input data from either of the memory I/O bus 10 or the shadow register output bus 14, and to send or receive status or other control signals. The shadow register functional logic block 5 also produces control signals 19 which indicate to the shadow register 3 which data input to select (i.e., whether to select as data input the data on memory I/O bus 10 or the processed data on signature bus 11).

Figure 3:
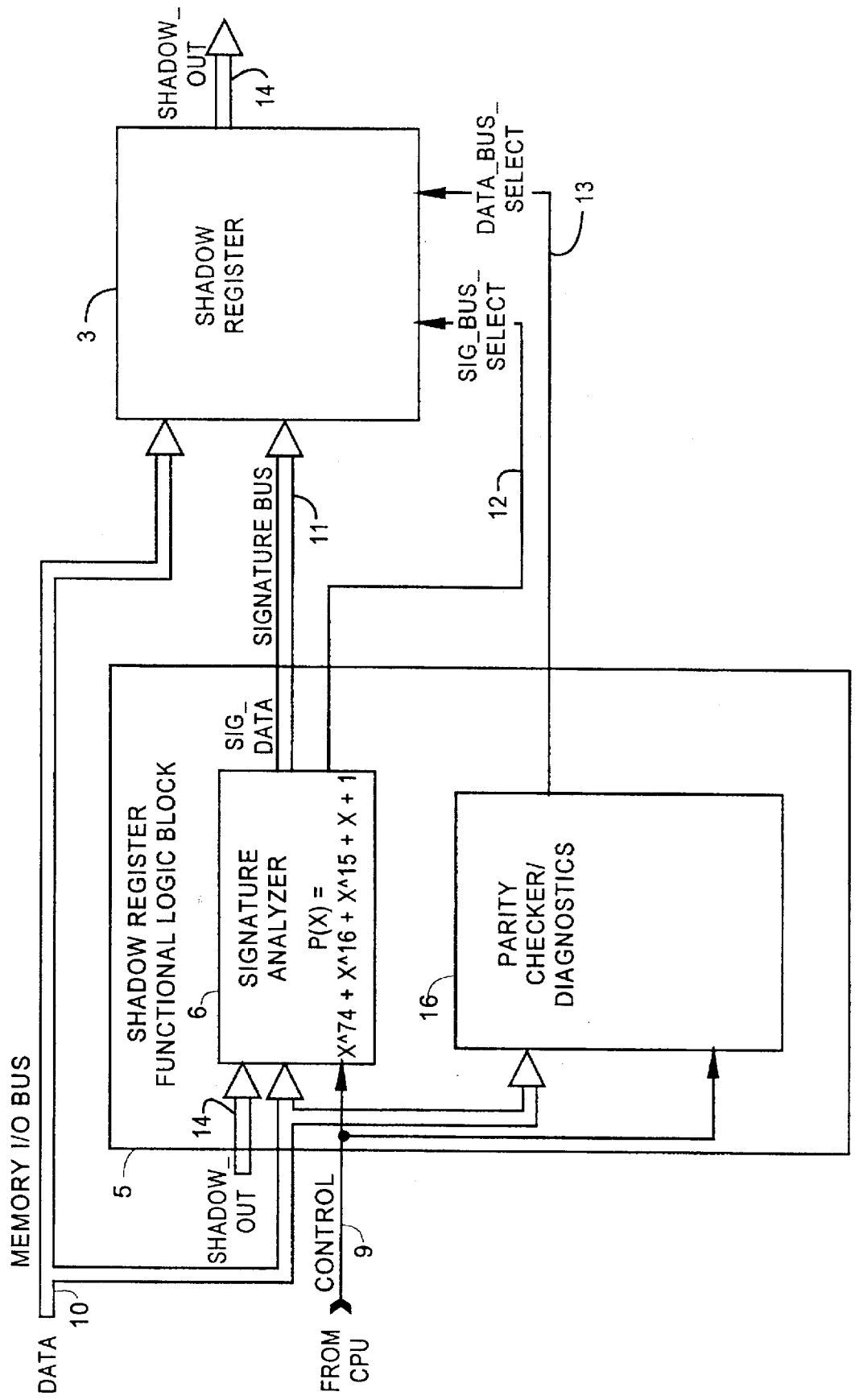
FIG. 3 is a block diagram of a shadow register controller and a shadow register in accordance with the preferred embodiment of the present invention.

FIG. 3 shows a block diagram of the shadow register 3 and shadow register functional logic block 5 of the preferred embodiment implementing the functional blocks shown in FIG. 2 including the signature analyzer 6, the parity checker 7, and the diagnostics block 8 of FIG. 2. As shown in FIG. 3, the functionality of parity checker 7 and diagnostics block 8 are combined into a parity checker/diagnostics block 16. As also shown in FIG. 3, the shadow register 3 receives two sets of data inputs, including the memory output data DATA present on memory I/O bus 10 and the signature data SIG_DATA produced by the signature analyzer 6 of the shadow register functional logic block 5 on signature bus 11. The shadow register 3 produces output SHADOW_OUT on shadow register output bus 14. The shadow register 3 receives select signals including signature data select signal SIG_BUS_SELECT 12 and memory output data select signal DATA_BUS_SELECT 13 which are used to select which data present on memory I/O bus 10 or signature bus 11 will be selected as input to the shadow register 3.

The signature analyzer 6 of the preferred embodiment receives data DATA from the memory I/O bus 10 and data SHADOW_OUT from the shadow register 3 on the shadow register output bus 14, processes the input data through a polynomial function on, and produces signature data SIG_DATA on signature bus 11. In the preferred embodiment, the linear polynomial function performed on the incoming data is defined by $p(x)=x^{74}+x^{16}+x^{15}+x+1$. As will be obvious to one skilled in the art, the polynomial function performed by the signature analyzer must match that of the process which originally generated the signature present in memory 2. The signature data SIG_DATA on signature bus 11 becomes data input to the shadow register 3. During signature analysis, the shadow register 3 receives a signature data select signal SIG_BUS_SELECT 12 which causes the shadow register 3 to receive the signature data SIG_DATA present on the signature bus 11 as input and ignore the data present on memory I/O bus 10. The signature data select signal SIG_BUS_SELECT 12 may be generated by the CPU 1 or, as shown in FIG. 3, may be generated by the signature analyzer 6.

The parity checker/diagnostics block 16 of the preferred embodiment receives memory output data DATA from the memory I/O bus 10 in parallel with the shadow register 3. During parity checking or diagnostic read operations, the shadow register 3 receives a data select signal 13 which causes the shadow register 3 to receive the data present on the memory I/O bus 10 as input. The data select signal 13 may be generated by the CPU 1, as shown in FIG. 3, or may be generated by the parity checker/diagnostic block 16. The parity checker/diagnostic block 16 generates the parity of the memory output data and compares it to the parity bit embedded in the data itself which was generated at the time the data was written to the memory 2. If the parity generated does not match the parity bit embedded in the data, further input to the shadow register 3 is disabled by disabling the memory I/O bus select signal DATA_BUS_SELECT until the parity error has been processed by the CPU 1. During diagnostic operations, the memory I/O bus select signal DATA_BUS_SELECT is only high, as determined by control signals 9 received from the CPU, when the CPU is performing a diagnostic read operation.

Figure 4:
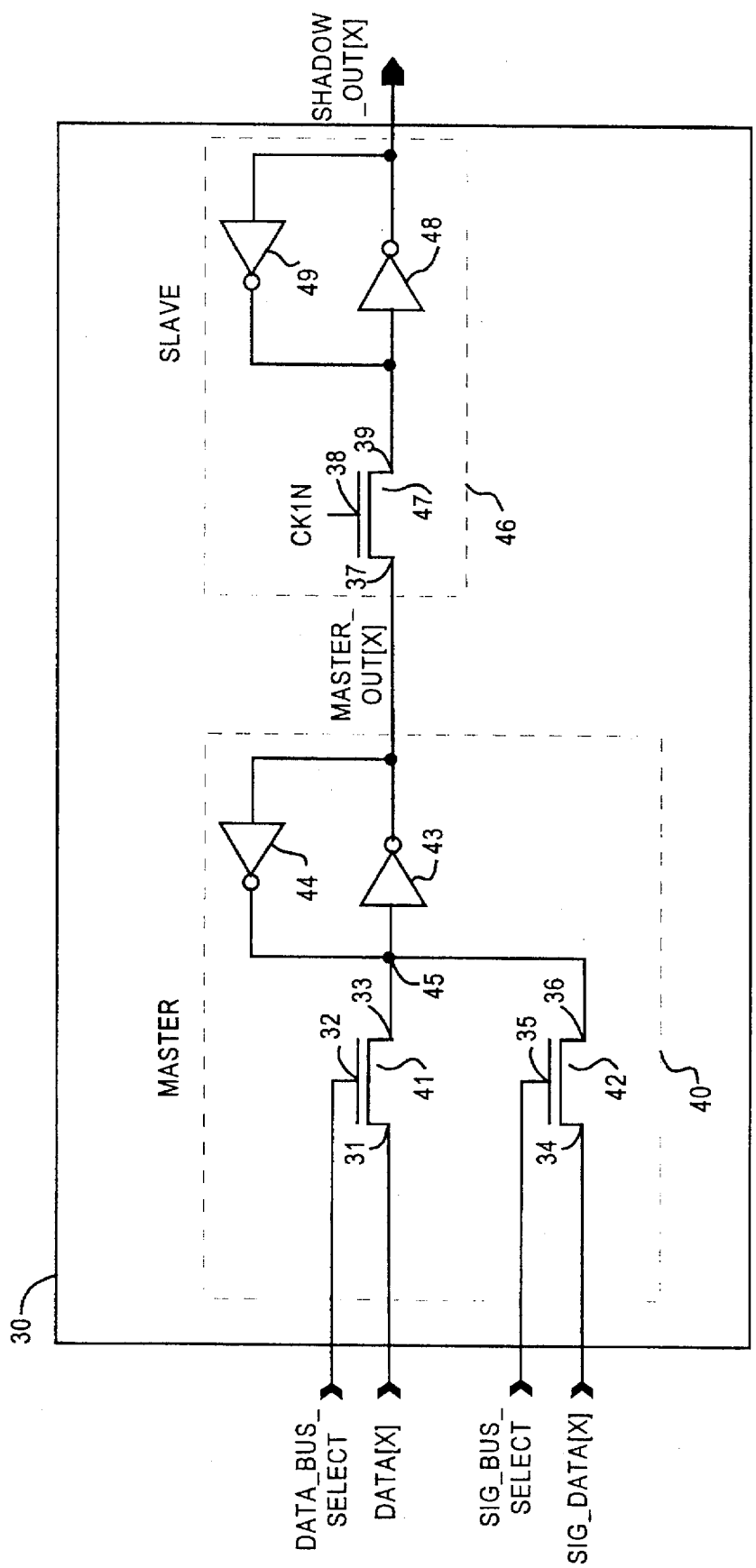
FIG. 4 is a schematic diagram of a shadow register used to implement the preferred embodiment shadow register of the present invention.

FIG. 4 is a schematic diagram of the preferred embodiment of a bit shadow register 30 used in implementing the shadow register 3 of FIG. 3 for a single data bit X. The data bus width in the preferred embodiment is 74 bits wide. Accordingly, the shadow register 3 of FIG. 3 comprises seventy-four parallel bit shadow registers 30 identical to that shown in FIG. 4. The bit shadow register 30 comprises a master transfer gate 40 and a slave transfer gate 46. The master transfer gate 40 has the timing of a non-overlapping clock signal CK2N, as will become apparent in the discussion below, while the slave transfer gate 46 is driven by and therefore has the timing of a separate non-overlapping clock signal CK1N. Accordingly, the master-slave latch configuration and the timing of non-overlapping clock signals CK1N and CK2N are such as to prevent signal races in the transfer of data through the shadow register. In the preferred embodiment, non-overlapping clock signal CK2N is the substantial complement of non-overlapping clock signal CK1N.

The master transfer gate 40 comprises a data bus transfer FET 41, a signature bus transfer FET 42, a master feed-forward inverter 43, and a master feedback inverter 44. The data bus transfer FET 41 is connected to receive data bit DATA[X] from the memory I/O bus 10 at its source 31. The memory I/O bus select signal DATA_BUS_SELECT drives the gate 32 of the data bus transfer FET 41. The drain 33 of data bus transfer FET 41 is connected at node 45. Similarly, the signature bus transfer FET 42 is connected to receive data bit SIG_DATA[X] from the signature bus 14 at its source 34. The signature bus select signal SIG_BUS_SELECT drives the gate 35 of the signature bus transfer FET 42. The drain 36 of signature bus transfer FET 40 is also connected at node 45. Accordingly, when the memory I/O bus select signal DATA_BUS_SELECT is high, the data bus transfer FET 41 turns on and allows data bit DATA[X] on memory I/O bus 10 to be transferred to node 45. Similarly, when the signature bus select signal SIG_BUS_SELECT is high, the signature bus transfer FET 42 turns on and allows signature bit SIG_DATA[X] on signature bus 14 to be transferred to node 45. The bus select signals DATA_BUS_SELECT and SIG_BUS_SELECT are configured to turn on at mutually exclusive times so that transfer FETs 41 and 42 are never on at the same time. A master feed-forward inverter 44 has an input connected to node 45 and an output upon which is produced a master transfer gate output signal MASTER_OUT[X]. A master feedback inverter 45 has an input connected to receive the signal MASTER_OUT[X] and an output connected to node 45.

The slave transfer gate 46 comprises a slave transfer FET 47, a slave feed-forward inverter 48, and a slave feedback inverter 49. The slave transfer FET 47 has a source 37 connected to receive the output signal MASTER_OUT[X] from the master transfer gate 40, a gate 38 connected to receive a non-overlapping clock signal CK1N, and a drain 39 connected to both the input of the slave feed-forward inverter 48 and the output of the slave feedback inverter 49. The slave feed-forward inverter 48 produces an output signal SHADOW_OUT[X]. The input of the slave feedback inverter 49 receives the signal SHADOW_OUT[X] and feeds it back to the input of slave feed-forward inverter 44.

Figure 5:
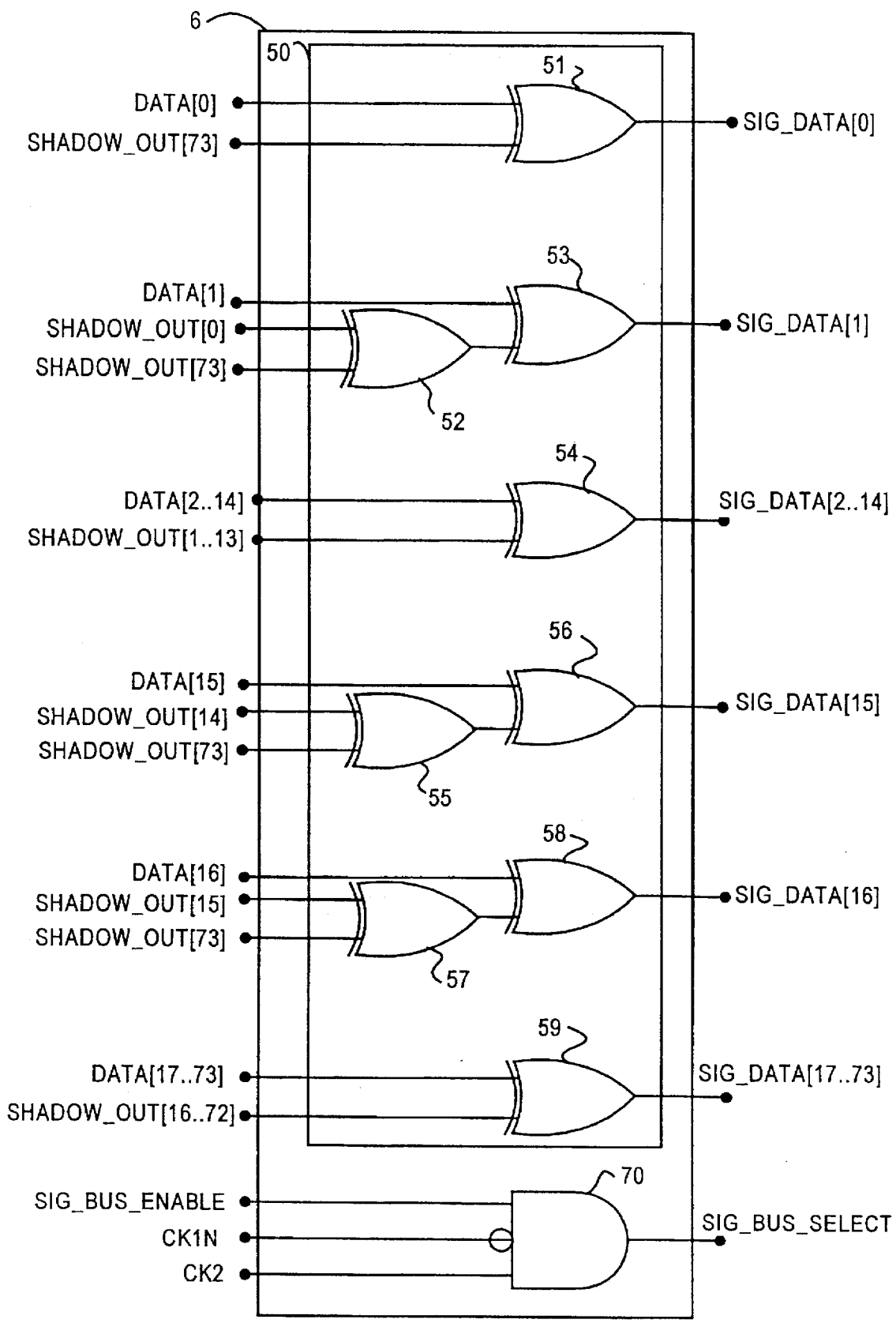
FIG. 5 is a schematic diagram of a linear feedback shift register used to implement the signature analyzer in the preferred embodiment of the present invention.

FIG. 5 is a logic diagram of the preferred embodiment implementation of signature analyzer 6 of FIG. 3. The preferred embodiment signature analyzer implementation is a linear feedback shift register (LFSR) 50 which performs the polynomial function $p(x)=x^{74}+x^{16}+x^{15}+x+1$ using exclusive OR gates 51–59.

As shown in FIG. 5, the term $x^{74}$ is implemented by performing an exclusive OR of data bits DATA[17 . . . 73] with the shifted shadow register slave output bits from the previous cycle SHADOW_OUT[16 . . . 72] using exclusive OR gate 59. The term $x^{16}$ is implemented using exclusive OR gate 57 which performs an exclusive OR of shifted shadow register slave output bit SHADOW_OUT[15] of the previous clock cycle and the most significant shadow register slave output bit SHADOW_OUT[73] of the previous clock cycle, followed by exclusive OR gate 58 which performs an exclusive OR of data bit DATA[16] and the output of exclusive OR gate 57. The term $x^{15}$ is implemented using exclusive OR gate 55 which performs an exclusive OR of shifted shadow register slave output bit SHADOW_OUT[14] of the previous cycle and the most significant shadow register slave output bit SHADOW_OUT[73] of the previous cycle, followed by exclusive OR gate 56 which performs an exclusive OR of data bit DATA[15] and the output of exclusive OR gate 55. The signature data bits SIG_DATA[2 . . . 14] are generated by exclusive OR gate 54 which performs an exclusive OR of data bits DATA[2 . . . 14] and shifted shadow register slave output bits SHADOW_OUT[1 . . . 13] from the previous clock cycle. The term "x" is implemented using exclusive OR gate 52 which performs an exclusive OR of shifted shadow register slave output bit SHADOW_OUT[0] of the previous clock cycle and the most significant shadow register slave output bit SHADOW_OUT[73] of the previous clock cycle, followed by exclusive OR gate 53 which performs an exclusive OR of data bit DATA[1] and the output of exclusive OR gate 53. The term "1" is implemented using exclusive OR gate 51, which performs an exclusive OR of data bit DATA[0] and the most significant output signature bit from the previous cycle SHADOW_OUT[73].

Accordingly, it will be appreciated from the above-described structure of the preferred embodiment that the signature analyzer 6 operates repetitively as follows. First, the signature analyzer 6 receives and combines data DATA[0 . . . 73] from memory I/O bus 10 and shadow register slave output data from the previous clock cycle SHADOW_OUT[0 . . . 73], and performs a polynomial function to produce signature data SIG_DATA[0 ... 73]. The signature data SIG_DATA[0 ... 73] is sent to the shadow register 3 which produces shadow register slave output data SHADOW_OUT[0 ... 73] for the current clock cycle. The process is repeated each clock cycle until the final signature is obtained.

A typical application of the signature analyzer 6 is a memory test performed at system power-up and initialization time. The memory test may, for example, write a pattern into the entire memory array during a first pass. During subsequent passes, the data from each location is first read back by the CPU and sent, in parallel, through the signature analyzer, and then a new pattern is written to the location. The final signature SIG_DATA[0 ... 73] after the entire memory array has been read back should match the correct signature value of the entire data pattern written into the array had there been no memory errors. The correct signature value is typically determined by simulating the memory test in software, recording the final signature, and embedding the final signature value into the bootup code. If the actual signature after having performed the memory test does not match the expected final signature value, this indicates bad memory bits in the memory array. Another type of memory test which may be performed using the signature analyzer is a CRC test. A CRC test is often performed on program instruction memory. The program instruction memory is pre-processed to determine a checksum which is appended to the end of the program memory. The signature analyzer 6 may be used to generate a checksum on program instruction memory which may be compared to the pre-processed checksum appended to the end of the program memory.

FIG. 5 also shows the preferred embodiment implementation for generating the signature bus select signal SIG_BUS_SELECT. As shown in FIG. 5, the signature bus select signal SIG_BUS_SELECT is generated by a 3-input AND gate 70. The AND gate 70 receives a signature bus enable signal SIG_BUS_ENABLE from the CPU, a non-overlapping clock signal CK1N, and an overlapping clock signal CK2. The clock signals CK1N and CK2 are system clocks which are substantially complementary. Filtering the signature bus enable signal SIG_BUS_ENABLE, non-overlapping clock signal CK1N and overlapping clock signal CK2 through the AND gate 70 causes the signature bus select signal SIG_BUS_SELECT to be enabled only when the CPU determines it to be by enabling signal SIG_BUS_ENABLE, while also having the timing characteristics of a non-overlapping clock signal CK2N. Maintaining non-overlapping clock timing is important for avoiding signal races throughout the system.

Figure 6:
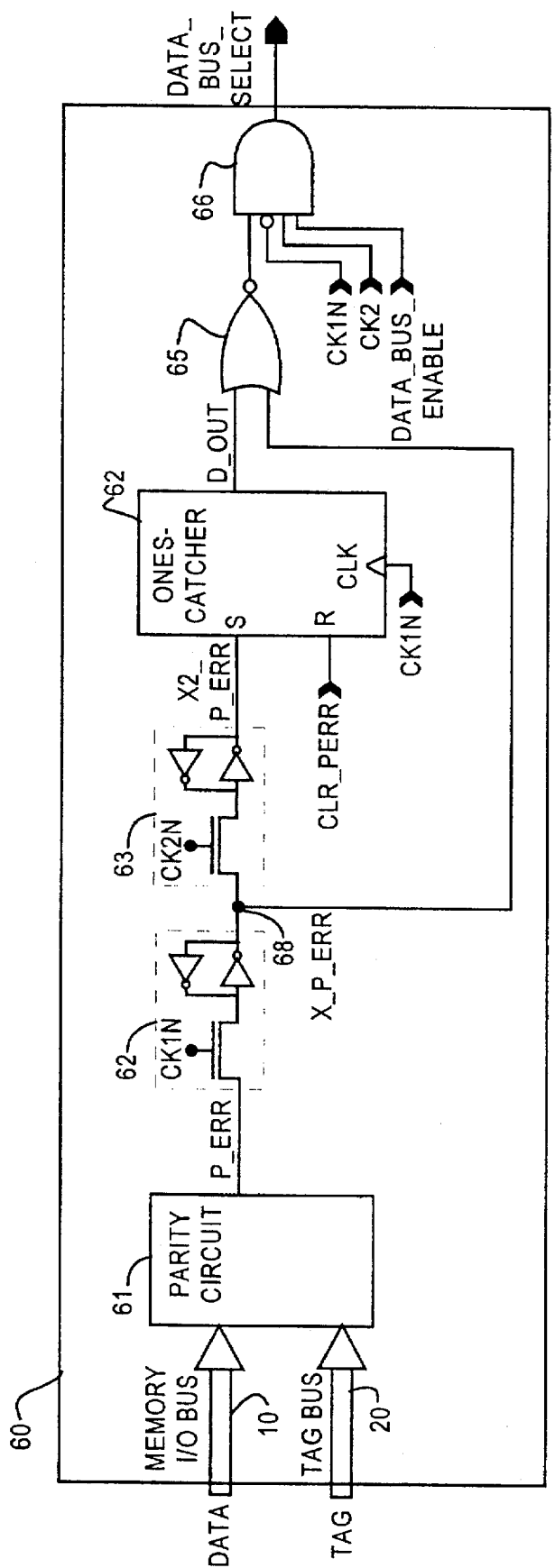
FIG. 6 is a schematic block diagram of a parity checker circuit used in the preferred embodiment of the present invention.

FIG. 6 is a block diagram of a preferred embodiment of the parity checker/diagnostics circuit 16 of FIG. 3. The preferred embodiment parity checker/diagnostics circuit 16 includes a parity circuit 61 which receives memory output data DATA[0 ... 73] from the memory I/O bus 10, generates the parity, and produces a parity error signal P_ERR when a parity error is detected. The preferred embodiment may also receive 20-bit data TAG[0 ... 19] received on tag bus 20 and output from one or more tag arrays associated with memory 2 when the memory 2 is a cache memory. The parity checking of the tag data TAG[0 ... 19] is useful if a parity error occurs during a cache miss, then the cache miss may be due to a parity error on the tag data. Thus, when a parity error occurs on the tag data during a cache miss, any parity error on the memory output data DATA may be ignored. The parity checker/diagnostics circuit 16 also includes a first transfer gate 62, a second transfer gate 63, a ones-catcher latch 64, a NOR gate 65, and an AND gate 66. The first transfer gate 62 receives the parity error signal P_ERR. The first transfer gate 62 is clocked by non-overlapping signal CK1N, and transfers the parity error signal P_ERR to produce transferred parity error signal X_P_ERR on output node 67 when the non-overlapping clock signal CK1N is in an enable state. The second transfer gate 63 is connected to receive the transferred parity error signal X_P_ERR on node 67. The second transfer gate 63 is clocked by substantially complementary non-overlapping signal CK2N, and transfers the transferred parity error signal X_P_ERR to produce a second transferred parity error signal X2_P_ERR on an output node 68 when the non-overlapping clock signal CK2N is in an enable state. The ones-catcher latch 64 has two data inputs for receiving the second transferred parity error signal X2_P_ERR and a clear parity error signal CLR_PERR. The ones-catcher latch 64 also has a clock input CLK and produces an output D_OUT when a signal received at the clock input CLK is in an enable state. In the preferred embodiment the ones-catcher latch is implemented using an R-S flip-flop. The ones-catcher latch 64 is connected to node 68 to receive the second transferred parity error signal X2_P_ERR from second transfer gate 63 as a first data "set" input S. The ones-catcher latch 64 receives the clear parity error signal CLR_PERR as a second data "reset" input R. In the preferred embodiment, the clear parity error signal CLR_PERR is generated by the CPU 1. The clock input of the ones-catcher latch is clocked by non-overlapping signal CK1N. In operation, the output of the ones-catcher D_OUT will be low initially. If a parity error is detected, the parity error signal P_ERR will go high, causing the transferred parity error signal X_P_ERR and subsequently the second transferred parity error signal X2_P_ERR to go high on the next half clock cycle and next full clock cycle respectively. When the second transferred parity error signal X2_P_ERR goes high, the R-S latch is set, causing the output D_OUT of the ones-catcher latch 64 to go high as soon as the non-overlapping clock signal CK1N at the clock input CLK is enabled. Once the R-S latch is set, the output D_OUT of the ones-catcher will remain high until it is cleared (or "reset") by the clear parity error signal CLR_PERR received at its second "reset" input R. The output D_OUT of the ones-catcher 64 and the transferred parity error signal X_P_ERR on node 67 are NORed by NOR gate 65 so that the output of NOR gate 65 will be high only if neither the output P_ERR of the parity circuit 61 nor the output D_OUT of the ones-catcher 64 are high (i.e., a parity error has just been detected or a previous parity error has not yet been cleared by the CPU). If a parity error has been detected (i.e., P_ERR is high) and/or it has not yet been cleared, the output of NOR gate 65 will be low, which is used to disable any further data input to the shadow register.

AND gate 66 receives and performs an AND operation on the output of NOR gate 65, the non-overlapping clock signal CK1N and overlapping clock signal CK2, and a control signal DATA_BUS_ENABLE to provide the memory I/O bus select signal DATA_BUS_SELECT. The control signal DATA_BUS_ENABLE is generated by the CPU 1 and is enabled during normal operation to allow parity error handling or during diagnostic reads. The control signal DATA_BUS_ENABLE is disabled during signature analysis. The non-overlapping clock signal CK1N and overlapping clock signal CK2 are included in the input signals of AND gate 66 to ensure that the memory I/O bus select signal DATA_BUS_SELECT has the timing of a non-overlapping clock signal CK2N. Accordingly, when the control signal DATA_

BUS_ENABLE is enabled, the memory I/O bus select signal DATA_BUS_SELECT will be enabled according to the output of NOR gate 65 and have the timing characteristics of a non-overlapping clock signal CK2N. If a parity error is detected or has not yet been cleared by the CPU, the output of NOR gate 65 will be low, causing the output of AND gate 66 to remain low during the enable states of the non-overlapping clock signal CK2N timing, and thereby disable the master transfer gate 40 of the shadow register 3 until a parity error has not been detected and any previously detected parity error has been cleared by the CPU 1 via signal CLR_PERR.

Figure 7:
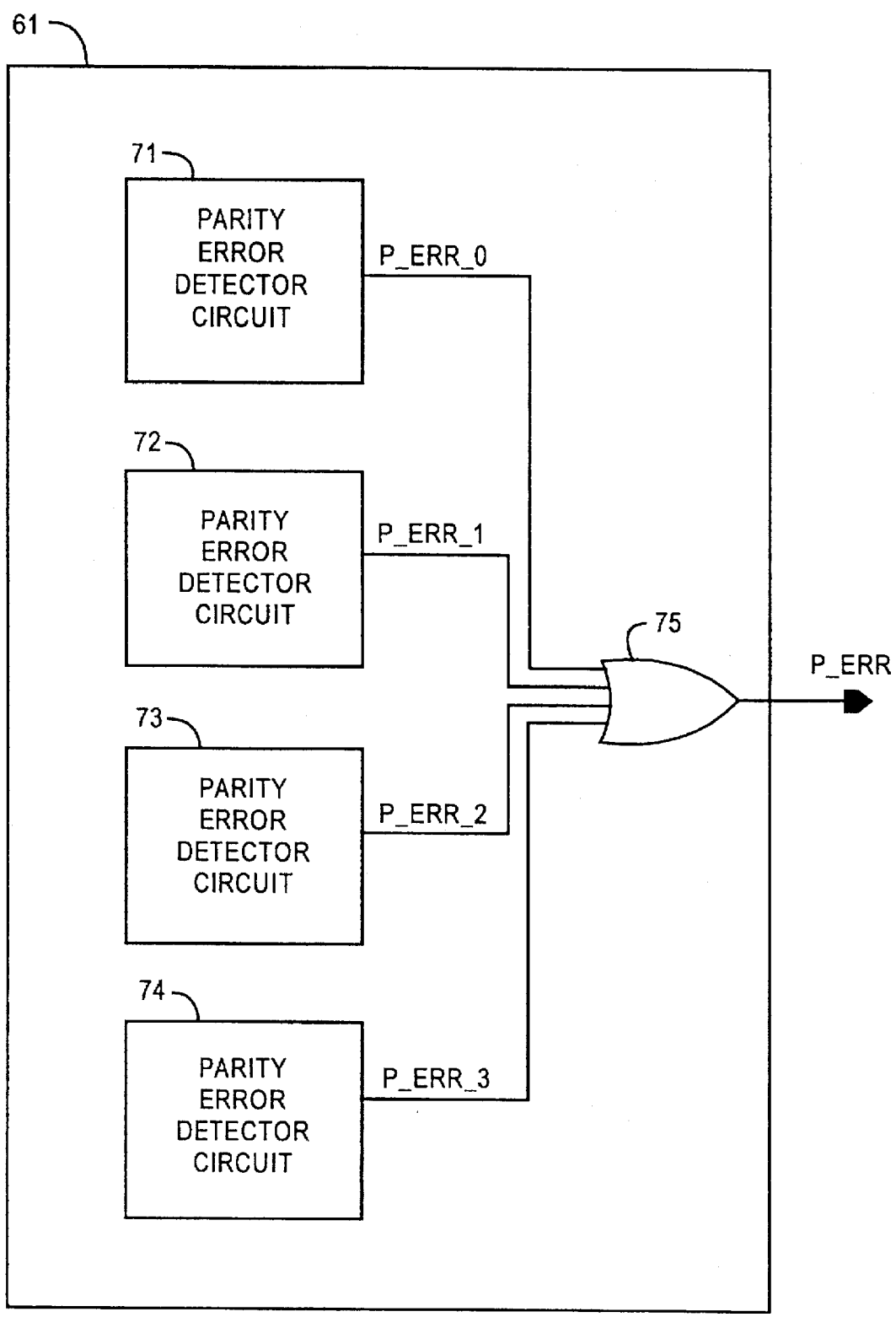
FIG. 7 is a block diagram of a parity circuit used in the preferred embodiment of the parity checker circuit of FIG. 6.

FIG. 7 is a schematic diagram of the parity circuit 61 of FIG. 6 used in the preferred embodiment of the present invention. As shown in FIG. 7, parity error detection for the 74 bit memory I/O bus of the preferred embodiment may be performed by four parity error detector circuits 71–74. Each parity error detector circuit 71–74 receives 16 to 18 different data bits of the 74 bit bus, performs parity error detection on them, and generates a respective detected parity error signal P_ERR_0, P_ERR_1, P_ERR_2, and P_ERR_3. An OR gate 75 receives the respective detected parity error signals P_ERR_0, P_ERR_1, P_ERR_2, P_ERR_3, performs an OR operation on them, and generates the parity error signal P_ERR which is output from the parity circuit 61 as shown in FIG. 6. Parity error detection is known in the art. Accordingly, it will be appreciated that the parity error signal P_ERR may be generated by many other methods and circuits. Furthermore, it will be appreciated that the number of data bits from which parity is detected will vary depending on the width of the memory I/O bus and perhaps a limited number of bits of interest. In addition, as in the preferred embodiment, additional parity error detector circuits may be implemented to generate parity on tag data from tag arrays associated with the memory 2. As mentioned previously, if parity is generated for the tag data and a tag data parity error occurs during a cache miss, any parity error occurring on the memory output data may then be ignored since the parity error on the memory output data may be due to the parity error on the tag data.

Figure 8:
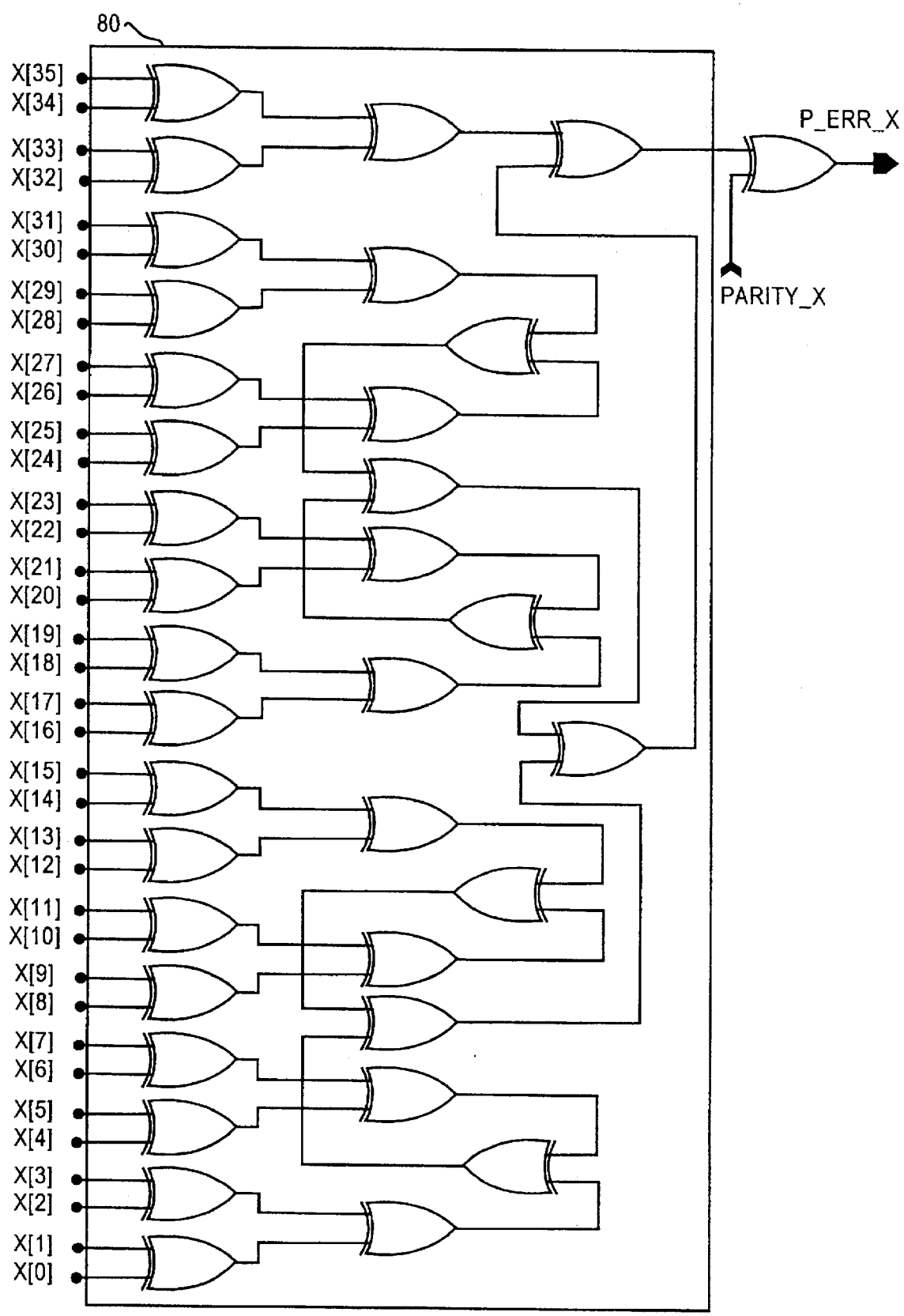
FIG. 8 is a logic schematic of a parity detector circuit used in the parity checker circuit of FIG. 7.

FIG. 8 is a more detailed schematic diagram of a parity error detector circuit 80 used to implement the parity error detector circuit 71–74 in FIG. 7. The parity error detector circuit 80 performs parity error detection on thirty-six incoming data bits X[N], where N::0 . . . 35. The order of data bits X[N] may, but do not necessarily, correspond directly to the memory output data DATA[N]. The parity error detector circuit 80 comprises a set of exclusive OR gates arranged in a binary tree. For a thirty-six-bit parity error detector circuit as shown in FIG. 8, the base of the binary tree includes eighteen exclusive OR gates. The next level of the binary tree includes nine exclusive OR gates, the next level includes four exclusive OR gates, the next level includes two exclusive OR gates, and the final level includes one exclusive OR gate. The layout shown in FIG. 8 is folded back in order to conserve space. As shown in FIG. 8, each incoming data bit X is received by an exclusive OR gate in the base level of the binary tree of exclusive OR gate. The parity error detector circuit 80 generates a parity signal PARITY_OUT at the output of the final level exclusive OR gate. The PARITY_OUT signal from the parity error detector circuit 80 is exclusive-ORed with a PARITY_IN signal to generate the parity error signal P_ERR_X of the parity error detector circuit 80. The PARITY_IN signal is derived from a parity bit in the data itself. The value of the parity bit in the data is generated in the preferred embodiment by a parity generator circuit identical to the parity error detector circuit 80 and operating on the same data X[N], N::0 . . . 35. The parity bit is set at the time the data is written to rather than read from the memory 2. As will be appreciated by those skilled in the art, a single incorrect data bit X[N] output from memory 2 will cause the output P_ERR_X to be high. Accordingly, if any of the respective outputs P_ERR_0, P_ERR_1, P_ERR_2, P_ERR_3 of parity error detector circuits 71, 72, 73, 74 of FIG. 7 go high, the parity error signal P_ERR output by OR gate 75 will go high, thereby signaling that a parity error has been detected.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A multi-purpose shadow register apparatus in a computer system, said computer system having a central processing unit, a memory, a memory output select circuit, and a memory output bus which provides memory output data from the memory to the memory output select circuit, said multi-purpose shadow register apparatus comprising:

a shadow register in parallel with the memory output select circuit and connected to receive memory output data from the memory output bus, said shadow register being responsive to an output enable signal to provide shadow register output data on a shadow register output bus; and a shadow register functional logic block comprising a plurality of functional blocks which utilize the shadow register in a mutually time-exclusive manner.

2. The multi-purpose shadow register apparatus of claim 1, further comprising a functional logic block data bus, wherein:

the shadow register functional logic block produces functional logic block data on the functional logic block data bus.

3. The multi-purpose shadow register apparatus of claim 2, wherein the shadow register is connected to receive the functional logic block data from the functional logic block data bus and further comprises bus selection means for selecting as input either the memory output data from the memory output bus or the functional logic block data from the functional logic block data bus.

4. The multi-purpose shadow register apparatus of claim 3, wherein the shadow register functional logic block includes a functional block comprising a signature analyzer.

5. The multi-purpose shadow register apparatus of claim 4, wherein said signature analyzer is connected to receive the memory output data from the memory output bus, said signature analyzer performing a signature analysis function on the memory output data and producing signature data as the functional logic block data on the functional logic block data bus.

6. The multi-purpose shadow register apparatus of claim 5, wherein the bus selection means of the shadow register is configured to select as input the functional logic block data from the functional logic block data bus when the signature analyzer is in operation.

7. The multi-purpose shadow register apparatus of claim 4, wherein said signature analyzer comprises a linear feedback shift register.

8. The multi-purpose shadow register apparatus of claim 3, wherein the shadow register functional logic block includes a functional block comprising a parity checker.

9. The multi-purpose shadow register apparatus of claim 8, wherein said parity checker is connected to receive the memory output data from the memory output bus, said parity checker detecting a parity error in said memory output data and providing a parity error indicator from which the memory output data is caused to be trapped in the shadow register and provided as shadow register output data on the shadow register output bus.

10. The multi-purpose shadow register apparatus of claim 9, wherein said parity checker is further connected to receive tag data from a tag array associated with the memory, said parity checker further detecting a parity error in said tag data and providing the parity error indicator from which the memory output data is caused to be trapped in the shadow register and provided as shadow register output data on the shadow register output bus.

11. The multi-purpose shadow register apparatus of claim 8, wherein the bus selection means of the shadow register is configured to select as input the memory output data from the memory output bus when the parity checker is in operation.

12. The multi-purpose shadow register apparatus of claim 3, wherein the shadow register functional logic block includes a functional block comprising a diagnostics read circuit.

13. The multi-purpose shadow register apparatus of claim 9, wherein the bus selection means of the shadow register is configured to select as input the memory output data from the memory output bus when the diagnostics read circuit is in operation.

14. The multi-purpose shadow register apparatus of claim 3, wherein the bus selection means comprises:

a memory output bus selector switch responsive to a memory output bus select signal which causes the shadow register to select the memory output data from the memory output bus as input when the memory output bus select signal is in an enabled state; and a functional logic block data bus selector switch responsive to a functional logic block data bus select signal which causes the shadow register to select the functional logic block data from the functional logic block data bus as input when the functional logic block data bus select signal is in an enabled state;

wherein the memory output bus select signal and the functional logic block data bus select signal are in their respective enabled states at mutually exclusive times.

15. The multi-purpose shadow register apparatus of claim 1, wherein the shadow register functional logic block includes functional blocks comprising a signature analyzer, a parity checker, and a diagnostics read circuit.

16. A multi-purpose shadow register apparatus in a computer system, said computer system having a central processing unit, a memory, a memory output select circuit, and a memory output bus which provides memory output data from the memory to the memory output select circuit, said multi-purpose shadow register apparatus comprising:

a shadow register in parallel with the memory output select circuit and connected to receive memory output data from the memory output bus and functional logic block data from a functional logic block data bus and comprising bus selection means for selecting input from either the memory output bus or the functional logic block data bus, and said shadow register being responsive to an output enable signal to provide shadow register output data on a shadow register output bus; and a shadow register functional logic block comprising a plurality of functional blocks, each functional block utilizing the shadow register in a mutually time-exclusive manner, said shadow register functional logic block producing functional logic block data on said functional logic block data bus, wherein the shadow register functional logic block includes functional blocks comprising a signature analyzer, a parity checker, and a diagnostics read circuit;

said signature analyzer connected to receive the memory output data from the memory output bus for performing a signature analysis function on the memory output data and producing signature data as the functional logic block data on the functional logic block data bus;

said parity checker connected to receive the memory output data from the memory output bus for detecting a parity error in said memory output data and providing a parity error indicator from which the memory output data is caused to be trapped in the shadow register and provided as shadow register output data on the shadow register output bus;

said bus selection means of the shadow register configured to select as input the functional logic block data from the functional logic block data bus when the signature analyzer is in operation and configured to select as input the memory output data from the memory output bus when the parity checker or the diagnostics read circuit is in operation.

* * * * *